United States Patent
Moyer

(10) Patent No.: US 7,047,511 B2
(45) Date of Patent: May 16, 2006

(54) ELECTRONIC CIRCUIT DESIGN

(75) Inventor: Thomas P. Moyer, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 10/672,715

(22) Filed: Sep. 26, 2003

(65) Prior Publication Data

US 2005/0071796 A1 Mar. 31, 2005

(51) Int. Cl.
G06F 17/50 (2006.01)
(52) U.S. Cl. ............... 716/8; 716/1; 716/7; 716/11; 716/12
(58) Field of Classification Search ............... 716/12, 716/1, 7, 8, 11
See application file for complete search history.

(56) References Cited

U.S. PATENT DOCUMENTS

| 5,559,718 | A | | 9/1996 | Baisuck et al. ............... 716/5 |
| 5,629,861 | A | | 5/1997 | Kim ............................ 716/8 |
| 5,694,481 | A | | 12/1997 | Lam et al. ................ 382/145 |
| 5,774,358 | A | * | 6/1998 | Shrote ......................... 700/86 |
| 6,289,116 | B1 | | 9/2001 | Chamberlain et al. ...... 382/141 |
| 6,529,913 | B1 | | 3/2003 | Doig et al. ................... 716/11 |

FOREIGN PATENT DOCUMENTS

JP 4048387 A 2/1992

OTHER PUBLICATIONS

"Gerber RS-274X Format-User's Guide", *Gerber Format Guide*, Barco Graphics N.V., Gent, Belgium, 1998.

* cited by examiner

Primary Examiner—Sun James Lin
(74) Attorney, Agent, or Firm—James J. Cioffi, Esq.; Hoffman, Warnick & D'Alessandro, LLC

(57) ABSTRACT

A method, system, program product and database for electronic circuit design configured to reduce data storage and computer resource requirements. The invention is binary based and leverages the redundancy of features in most electronic circuit designs by using templates of unique design features. Each template includes offset instructions for positioning the unique design feature relative to a control point rather than a previous feature. The control point is positioned within a design grid according to data in a template recall that replaces the unique design feature's instruction set in an instruction list of a design instruction file. Because each template is stored once, and only once, considerable reduction in design data size is achieved. In addition, each template recall has a fixed width data format that restrains data size and allows more efficient processing.

20 Claims, 6 Drawing Sheets

ELECTRONIC CIRCUIT DESIGN

BACKGROUND OF THE INVENTION

1. Technical Field

The present invention relates generally to electronic circuit design, and more particularly to a system, method, program product and database for electronic circuit design.

2. Related Art

Electronic circuits are often designed using automated design systems to increase the speed of the design process, and to allow evaluation of a design prior to actual production. In a conventional setting, a designer uses the automated design system to generate a circuit by inputting data at a computer workstation. A designer will typically design a circuit in terms of functional aspects and then deconstruct each aspect into ever-smaller features. For example, a designer may establish a functional aspect and then draw several simple features in laying out components for the functional aspect, and may free-hand a number of larger more unique features to handle special circumstances. Layout of features providing the functional aspects of the circuit may be spread out over numerous layers. A design ultimately results in a design file that includes instructions on how the circuit features are laid out over a design grid(s) that maps features' relative positions.

Although automated design systems provide substantial support to designers, the ever-increasing complexity of circuits has resulted in design instruction files of extremely large proportions. The large design instruction files strain resources in a number of ways. First, automated design system performance resources must be continuously increased to sustain preferred speed. Second, storage requirements of the myriad of design feature instructions and the design instruction files must continuously be increased. As a result, the expense of design workstations and related storage facilities has become an increasing problem.

One reason for such large design instruction files is that the data for design implementation is presented in the form of an extremely long instruction list that an automated design system can use to generate the design. Unfortunately, each time a feature is required in a design, its respective instruction portion is repeated in the instruction list. That is, each feature has all instructions (data) required for its implementation present in the instruction list every time the feature is required. Each feature's instruction portion may include, for example: its shape, which net it's on, which layer it's on, etc. This redundant usage of instruction portions occurs despite the fact that most designers create designs that have a fairly low number of unique features. For example, even for complex designs such as a multiple level ceramic design having, for example, 12,123,402 total features, the number of uniquely shaped features may be relatively small, e.g., 5147.

One approach used to limit the size of design data is to have placement instructions for each feature based on a previous structure's location. Accordingly, each instruction list must be maintained as an integrated unit such that each feature's position relative to a prior feature can be determined. This situation presents a number of drawbacks. First, compartmentalizing the instruction list and removing data from the list are slow. Second, evaluating a single feature, e.g., for capacitance, that is within the instruction list, e.g., feature 10 million, requires computation beginning at the first feature.

Another problem with the conventional design instruction file is created by the fact that each feature may have its own peculiarities requiring less or more data. For example, a simple structure may require 4 bytes, while a complex structure may require 15 bytes. The instruction list thus includes a variety of data width formats. This causes, a standard processor that is based on 4 byte or 8 byte multiples, e.g., a 32 bit or a 64 bit processor, to process data inefficiently.

One approach to address the above issues is referred to as the "Gerber format," the most recent version of which is referred to as the RS274X format, which was developed by Gerber Systems, now part of Mania Barco. The Gerber format provides a means of transferring printed circuit board information devices that convert the electronic printed circuit board (PCB) data to artwork produced by a photoplotter. As part of this format, an aperture list is implemented for recalling particular apertures to generate features, copies of which are used in the design. Unfortunately, this format suffers from a number of drawbacks in use as a design system. First, it is ASCII based, which greatly increases data instruction file size. Second, instruction lists are limited to shape characteristics only. Accordingly, data regarding net, layer characteristics, materials, specific capacitance, etc., are not expressible, and are not included. As a result, the Gerber format is not appropriate for design database use.

Another approach to the above issues is used in the IBM Graphics Language 1 (GL1). The GL1 language specifies a given feature by one of two methods. First, the location and geometric parameters for a given unique feature shape must be placed in memory at least once. The amount of memory required for a given feature shape is a function of it's complexity, for instance, a square requires only 4 numbers (X, Y, width, height) whereas a 60 sided polygon requires 120 numbers (X and Y for each of the 60 corners). The GL1 language allows further copies of the shape to be used by nesting the original copy. The nested copies are each stored as a variable width name data object. The second way another copy of a shape can be recorded is to create a new feature, with the attendant memory requirement. For example, a semiconductor design of a 60-sided polygon may require a feature to be created, for example, 1531 separate times. The GL1 language has all of the features stored as variable width data objects, which is inefficient because either a look up table of memory locations for features must be created and maintained, or serial reading of the entire feature list need be undertaken to access a given feature.

In view of the foregoing, there is a need in the art for an improved electronic circuit design methodology, system and product that does not suffer from the problems of the related art.

SUMMARY OF THE INVENTION

The invention includes a method, system, program product and database for electronic circuit design configured to reduce data storage and computer resource requirements. The invention is binary based and leverages the redundancy of features in most electronic circuit designs by using templates of unique design features. Each template includes an offset instruction for positioning the unique design feature relative to a control point rather than a previous feature. The control point is positioned within a design grid according to data in a template recall that replaces the unique design feature's instruction set in an instruction list of a design instruction file. Because each template is stored once, and only once, considerable reduction in design data size is achieved. In addition, each template recall has a fixed width data format that restrains data size and allows more efficient processing.

A first aspect of the invention is directed to a method for generating a design of an electronic circuit having a plurality of design features, the method comprising the steps of: storing a plurality of templates, each template including an offset instruction for generating a unique design feature relative to a control point; and generating at least a portion of the design according to a design instruction file that includes at least one template recall for recalling at least one template, each template recall having control point positioning data for positioning the control point for a respective template relative to a design grid such that a respective unique design feature is generated relative to the control point.

A second aspect of the invention is directed to a computer-readable medium for storing data for access by an electronic circuit design system executing on a data processing system, the computer-readable medium including a data structure including: a plurality of data objects, each data object comprising: a template including an offset instruction for generating a respective design feature relative to a control point.

A third aspect of the invention is directed to a computer program product comprising a computer useable medium having computer readable program code embodied therein for generating an electronic circuit design, the program product comprising: program code configured to recall a template for a design feature based on a fixed width format template recall in a design instruction file; and program code configured to generate the feature based on the template, wherein the template includes an offset instruction for generating the design feature relative to a control point.

A fourth aspect of the invention is directed to a data processing system executing an application program and containing a database used by the application program, the data processing system comprising: a processor for executing the application program; and a memory including a data structure accessible by the application program, the data structure comprising: means for recalling a template for a design feature based on a fixed width format template recall in a design instruction file; and means for generating the feature based on the template, wherein the template includes an offset instruction for generating the design feature relative to a control point.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

For purposes of convenience only, the following description includes the following headings: I. System Overview, II. Template, III. Design Instruction File, IV. Attribute Look Up Lists, and V. Operation Methodology.

I. System Overview

Figure 1:
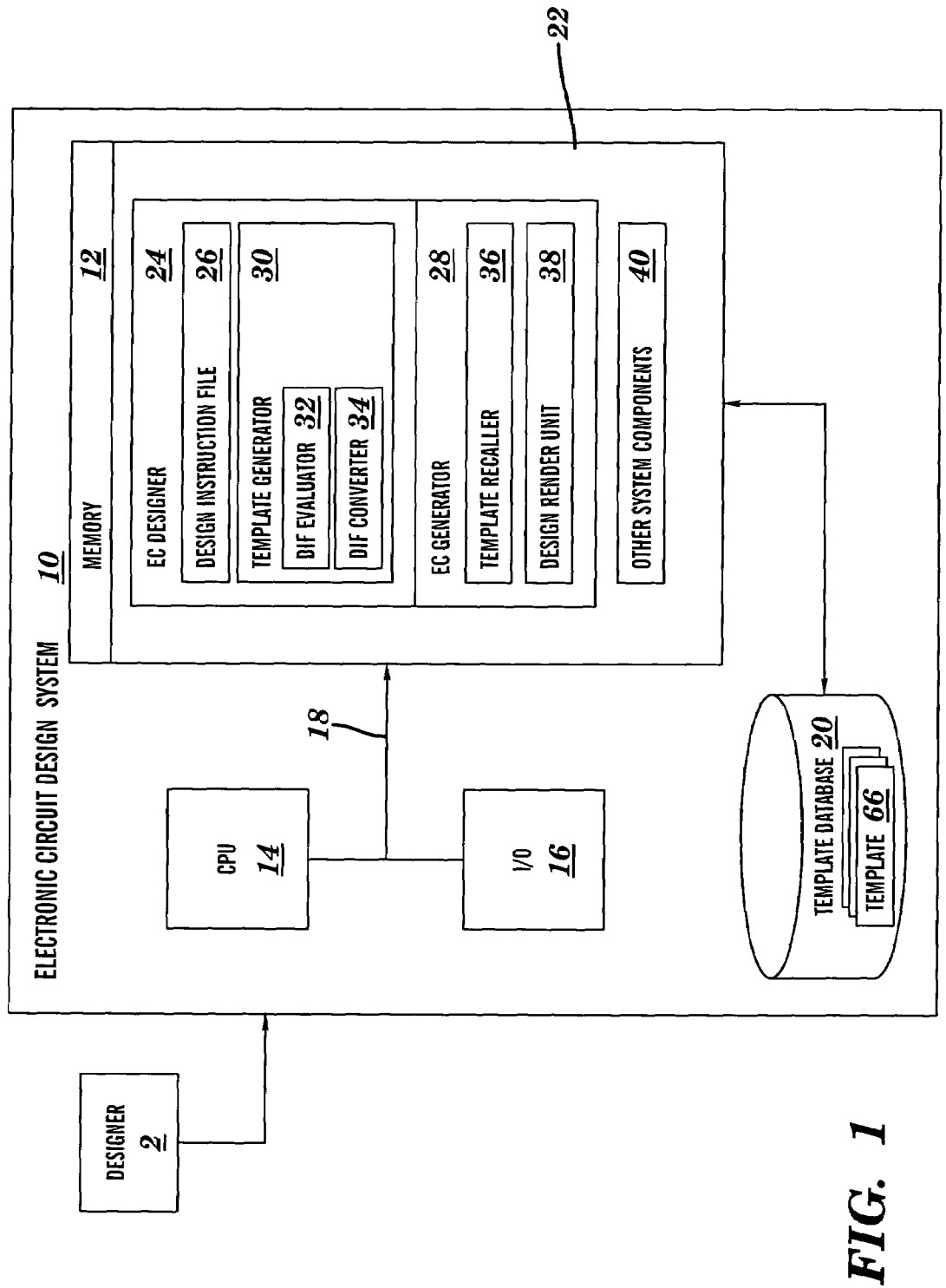
FIG. 1 shows a block diagram of an electronic circuit design system.

With reference to the accompanying drawings, FIG. 1 is a block diagram of an electronic circuit design system 10 in accordance with the invention. System 10 includes a memory 12, a central processing unit (CPU) 14, input/output devices (I/O) 16 and a bus 18. A template database 20 is also provided for storage of feature templates and other data relative to processing tasks, as will be described in greater detail below. Memory 12 includes a program product 22 that, when executed by CPU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. CPU 14 may likewise comprise a single processing unit, or a plurality of processing units distributed across one or more locations. CPU 14 may comprise an advanced mid-range multiprocessor-based server, such as the RS6000 from IBM, utilizing standard operating system software, which is designed to drive the operation of the particular hardware and which is compatible with other system components and I/O controllers. Alternatively, CPU 14 may include a PC-based workstation. I/O 16 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 1, program product 22 may include: an electronic circuit (EC) designer 24 for interacting with a designer 2 during design of a circuit and for generating a design instruction file 26 (hereinafter "DIF"); and an electronic circuit (EC) generator 28 for executing DIF 26 to render a design. EC designer 24 also may include a template generator 30 including a design evaluator 32 and a DIF converter 34. EC generator 28 may include a template recaller 36 for accessing template database 20 and a design render unit 38 for rendering a design based on DIF 26. Program product 22 may also include other system components 40 that may include any other processing function now known or later developed for use with electronic circuit design.

II. Template Database and Templates

Figure 2A:
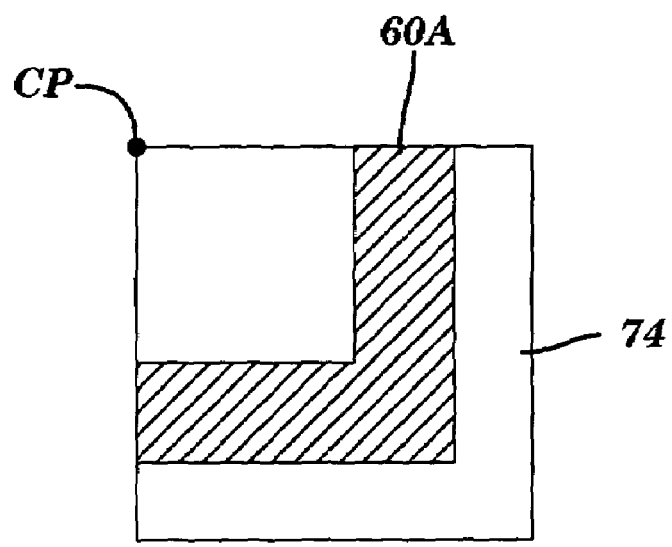
FIGS. 2A and 2B show renderings of unique design features presented in template form.

Referring to FIG. 2A to FIG. 5, template and template database implementation will now be described. Referring to FIG. 2A, a conceptual diagram illustrating a unique design feature 60A used in a design (not shown) and saved as a template in template database 20 (FIG. 1) is shown. In this case, unique design feature 60A is an angle structure. It should be recognized, however, the design features may take the form of any now known or later developed shape used in an electronic circuit design, e.g., circle, rectangle, arc, line, polygons, etc. FIG. 2B shows a unique design feature 60B, which is the same as unique design feature 60A, except it is rotated 180°. A template is provided in template database 20 (FIG. 1) for each respective unique design feature 60 in a circuit design and for each orientation 60A, 60B of unique design feature used.

Figure 3:
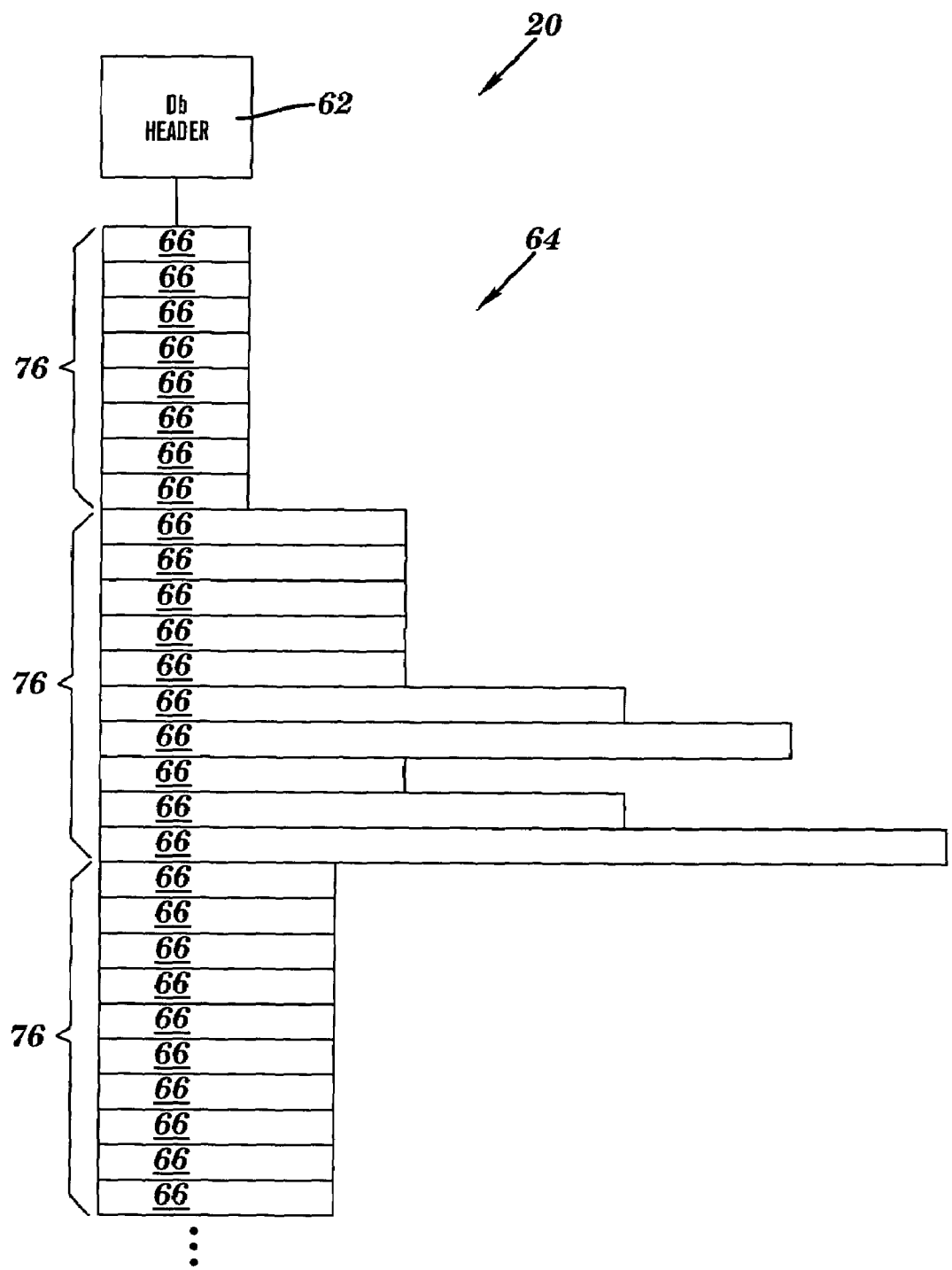
FIG. 3 shows a conceptual diagram of a template database.

Referring to FIG. 3, an illustration of template database 20 is shown including a header 62 and a plurality of data objects 64. Each data object 64 comprises a template 66 such that a plurality of templates 66 may be stored. In one embodiment, template database 20 preferably stores a plurality of templates 66 including a template for each of a substantial portion of the unique design features used in a design.

Figure 4:
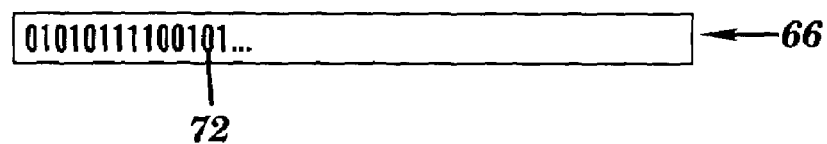
FIG. 4 shows a template as stored in the template database of FIG. 3.

FIG. 4 shows a template 66 as stored in template database 20. Each template 66 includes at least an offset instruction 72. "Offset instruction" 72 is a set of instructions executable by design render unit 38 of EC generator 28 to generate or render the respective unique two dimensional outline of the design feature relative to a control point CP. A "control point" CP is a point of reference from which template geometry is defined by the offset instruction 72 (see FIGS. 2A–2B). Because the units used in a template 66 can be smaller than the units of the design grid, one or more of the template geometric specifiers (e.g., center point for a circle, corner of a line, corner of a polygon) can be between the design grid locations. When a template is rendered, a control point CP of a template 66 is placed on one of the design grid locations. For example, for a rectangle feature, offset instruction 72 may include the four (4) corner locations relative to control point CP. Alternatively, for the same shape, a location of a corner on control point CP, a length, a width, and an angle of rotation may be provided. As will be appreciated, the size of offset instruction 72 will vary depending on an associated unique design feature 60. Because offset instruction 72 for each unique design feature 60 is stored once and only once, considerable reduction in the size of design data and DIF 26 is achieved. Each template 66 may also include other information regarding a feature such as: number(s) "N" of attribute look up list(s) (described below) associated with each instance of the template; a list of "N" designations as to which attribute look up lists are associated with each instance of the template; a list of "N" specifiers as to which members from each of the "N" associated attribute look up lists is associated with each instance of the template; a selector for indicating to EC generator 28 an aspect of how to interpret the offset instruction 72; specifier(s) for different dimensional units used within offset instruction 72 that are used to specify the design grid upon which the template instance control point CP is fixed; a designation that template 66 is an inside shape (an opening in another feature), an outside shape, or that the template conforms to the criteria of being a convex polyhedron; and/or particular feature attributes (e.g., radius for a circle, width or length for lines, orientation, number and/or location of vertices, etc.)

Figure 2B:
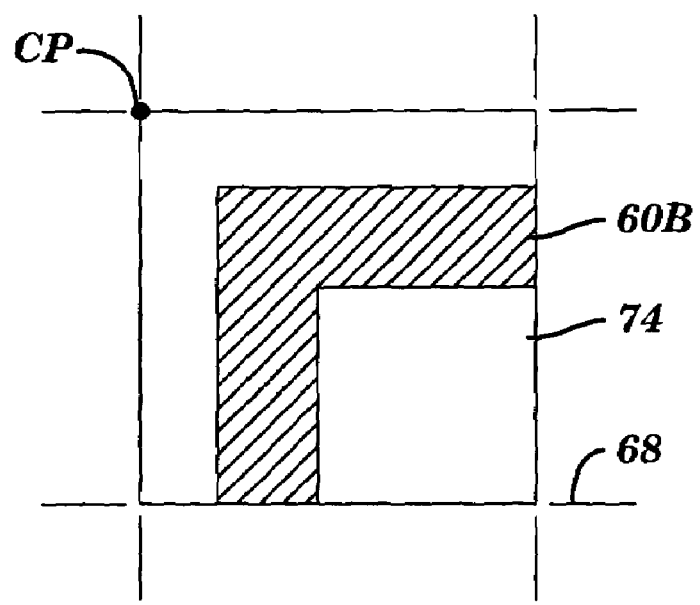

"Generate" or "render," as used herein, means that unique design feature 60 is built in such a way that designer 2 (FIG. 1), using system 10, can meaningfully use the data, e.g., system 10 may display, generate data for performance evaluation, or perform any other task that a system 10 may now or later provide. A "design grid" 68 (FIG. 2B) can be any well-known grid implemented by an EC designer 24 used for laying out a floorplan, or map, of an electronic circuit. Control point CP is positioned on design grid 68 according to control point positioning data in a template recall of the DIF 26, as will be described in greater detail below. That is, each template's unique design feature 60 is not positioned relative to a previous feature, but rather relative to the origin of the design grid. In particular, as shown in FIGS. 2A, 2B, each template has an offset instruction 72 (FIG. 4) that allow rendering of a respective unique design feature 60A, 60B as though it includes a bounding orthogonal polygonal border 74 with a respective control point CP located at a corner of the polygonal border.

Bounding orthogonal polygonal border 74 allows capturing of practically any unique design feature (during design) and positioning of the unique design feature appropriately in conjunction with a control point CP. Specifying a control point CP as one of the corners of bounding orthogonal polygonal border 74 speeds calculations related to shape intersection. Bounding orthogonal polygonal border 74 also allows quick ordering of multiple types of features, e.g., circles vs. polygons vs. lines. The ordered instruction list 90 (FIG. 6) of features is scanned looking for potential shape intersections according to the observation: the more extensive geometric calculations of the more complex shape intersections need be undertaken only if the bounding orthogonal polygonal borders overlap. Bounding orthogonal polygonal border 74, however, is provided only for reference relative to unique design features saved as templates, and does not make up any part of the ultimate design.

Figure 5:
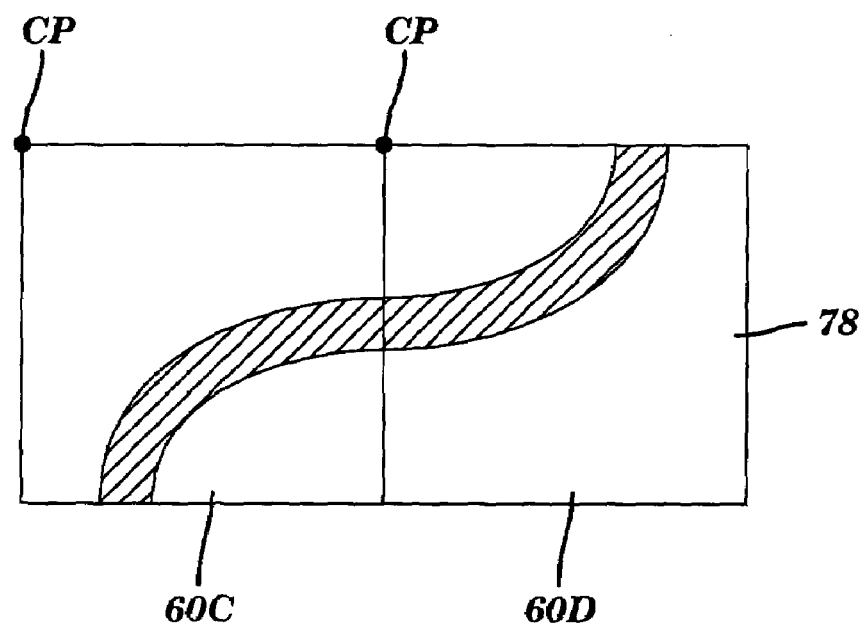
FIG. 5 shows a rendering of a nested template including two unique design features in template form.

Referring to FIG. 5, plurality of templates 66 may also include a nested template 78 including an offset instruction 72 (FIG. 4) for generating a plurality of unique design features 60C, 60D simultaneously. Although two unique design features 60C, 60D are shown in FIG. 5, instruction sets for generating any number of design features may be grouped together to form a nested template 78. In addition, although two control points CP are shown, only one control point CP may be necessary.

As will be described further below, as DIF 26 is executed, each template 66 referred to in the DIF is recalled by the DIF executing on system 10, i.e., recalled by template recaller 36 and executed by design render unit 38.

III. Design Instruction File

Figure 6:
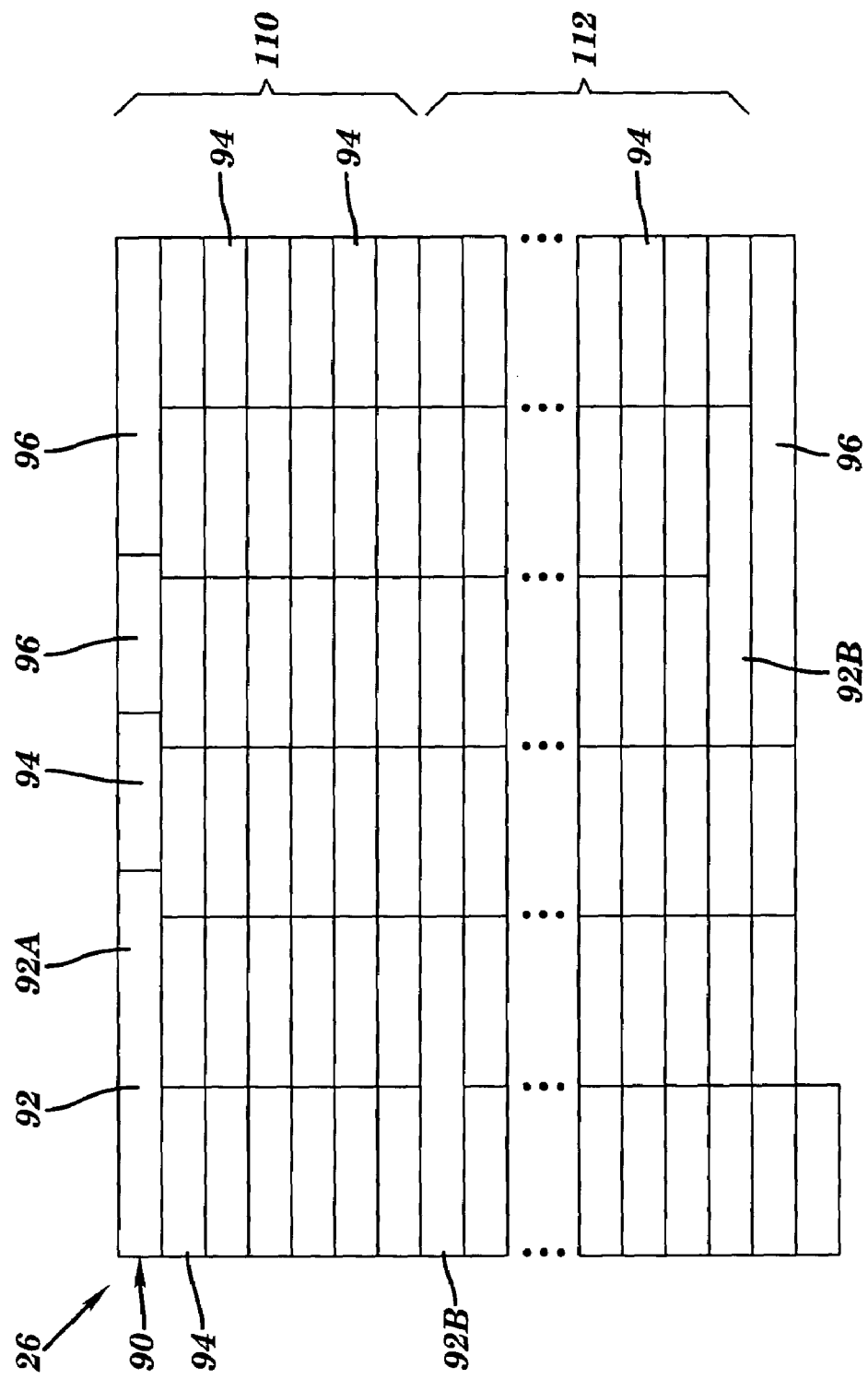
FIG. 6 shows a design instruction file including an instruction list having template recalls for recalling templates.

Turning to FIG. 6, details of a DIF 26 are illustrated. DIF 26 includes an instruction list 90 that includes a listing of instructions executable by design render unit 38 for generating or rendering a design. Instruction list 90 is created by designer 2 (FIG. 1) using an EC designer 24 of system 10, as will be described in greater detail below. Instruction list 90 differs from conventional instruction lists, however, in that instructions for a repetitively used, unique feature(s) 60 (FIGS. 2A–2B, 5) are replaced with a template recall 94 for recalling an associated template 66 from template database 20. Instruction list 90 of DIF 26 may include any number of template recalls 94. In addition, instruction list 90 may include a header(s) 92 and instruction set(s) 96 for generating design features that do not have a data size benefit for being saved as templates, e.g., non-repetitive features.

Figure 7:
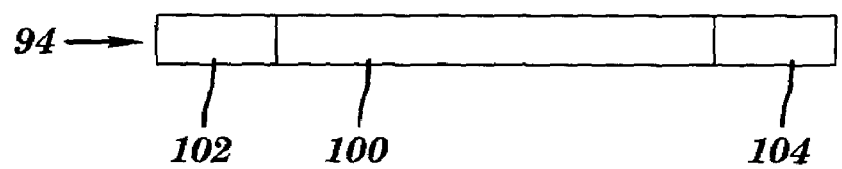
FIG. 7 shows details of a template recall of FIG. 6.

Referring to FIG. 7, in one embodiment, each template recall 94 includes: a template identifier 100, control point positioning data 102 for positioning a control point CP for a respective template relative to design grid 68 (FIG. 2B), and a net identifier 104. Template identifier 100 identifies a template 66 to be recalled, and hence, a respective unique design feature 60. In one embodiment, template identifier 100 is the ordinate of the ordered list of templates, e.g., 1000 would be the one thousandth stored template 66 (FIG. 3). It should be recognized that a variety of other techniques may be employed for matching a template recall 94 with a required template's data. Net identifier 104 identifies to which network a template's unique design feature template belongs, e.g., power, ground, signal, orphans, etc.

With regard to control point positioning data (hereinafter "CPP data"), the data includes planar positioning coordinates on design grid 68 (FIG. 2B) at which a control point CP for a respective template is to be positioned, and hence, where an associated unique design feature will be located. The coordinates can be any type of well-known coordinates such as polar coordinates or Cartesian X-Y coordinates. In one embodiment, Cartesian X-Y coordinates are implemented in integer form, this being preferred over floating point types. Where Cartesian X-Y coordinates are used, they may represent the number of multiples of design grid 68 (FIG. 2B) spacing, as is common relative to the layout of other features. For example, in a design laid out on a 0.005 micron grid, the X-Y coordinates 2000, 20002 would represent an X coordinate of 10.00 microns, and a Y coordinate of 100.01 microns. The largest location specifiable would be 2 to the number of bits in integers minus 1 times the grid spacing. For 32 bit integers and a 0.005 micron grid, one can represent any location on a roughly 21.45 mm chip. Integers are preferred because the spacing between sequentially enumerable locations is uniform. This is a good match with the concept of a design grid, wherein all features must be located at multiples of a pre-selected small spacing (e.g., 0.01 micron).

Further data storage reductions may be attained by implementing each template recall 94 of DIF 26 in a fixed width format, which is preferably a multiple of system's 10, i.e., CPU's 14, defining byte width. That is, a multiple of 4 for 32 bit computers, and a multiple of 8 for 64 bit computers. In one preferred embodiment, each template recall 94 has a fixed width format of twelve (12) bytes including: eight (8) bytes for CPP data 102, two (2) bytes for template identifier 100, and two (2) bytes for net identifer 104. With regard to template identifier 100, two bytes allows for up to 65,536 possible templates, while four bytes allows for up to 4,294,967,295 possible templates, which is considered sufficient at this time to accommodate all possible unique design features. Designs, as input, can use the smaller two-byte template identifier 100 format, but the number of unique features on post data prepped designs may require four bytes. The "post data prep" state is one in which each of the individual features in a design have their boundaries shifted by an algorithm designed to compensate for the proximity of neighbors, which may drastically increase the number of templates. In view of the foregoing, in another embodiment, each template recall 94 may have a fixed width format of sixteen (16) bytes including: eight (8) bytes for CPP data 102, four (4) bytes for template identifier 100, and four (4) bytes for net identifier 104.

With regard to header(s) 92, DIF 26 may include a lead header 92A and any number of subsequent header(s) 92B. A lead header 92A may include, for example, a list of attributes of groups of features, number of signals per feature per layer, number of power/ground features per layer, layer names, layer thicknesses, layer geometric parameters (e.g., sidewalls are 30° angles, making bottom of layer smaller), net names, net type (power, ground, signal, copyright, orphans, descriptive alphanumeric), number of surface nodes per net, number of additional parametrics per net such as calculated and learned capacitances, time of flight, etc., which nodes per net, number of features per net, node chip names, node locations, node pad names, chipsite names, chipsite locations, chipsite extents, number of templates per class (e.g., circles, lines, polygons, arcs) and any other useful overall data regarding a particular design. Each subsequent header 92 may include the same or less information as may be required, for example, per layer.

IV. Attribute Look Up Lists

DIF 26 can also be configured such that a number of advantageous look ups are possible. For example, in one embodiment, DIF 26 may be configured with all template recall 94 instances on a single layer of the electronic circuit occurring together in a group 110, followed by all the template recall 94 instances for the next layer in a group 112, and so on until all template recall instances on all layers have been instantiated. In this fashion, where designer 2 (FIG. 1) knows the number of features on a layer, the designer can determine the layer upon which a feature is located quickly and simply via DIF 26. For example, where designer 2 (FIG. 1) wants to know which layer feature 2003 is in, and knows there are 1050 features in a first layer and 3000 features in the second layer, then feature 2003 is in the second layer. In this case, a layer (Z) designation in an instruction list is no longer necessary for each feature, which further reduces data size. In another embodiment, instructions within instruction list 90 (FIG. 6) of DIF 26 can also be organized according to other look ups such as network association. The fixed width format of template recalls 94 allows look ups to store indexes which allow shapes to be directly referenced, as opposed to a need to start at a related point, and follow sequential links toward a desired shape.

Another example application of attribute look up lists is in the construction and use of a network look up data object. Such a data object may be efficiently expressed within EC designer 24 by creating a number of variable length arrays, the number being equal to the number of nets enumerated within template recall 94 instances. In this case, EC designer 24 can establish a variable length array for a particular network, inspect net identifiers 104 of each instance of a template recall 94 in DIF 26, and add each template recall 94 ordinate (i.e., position in DIF 26) to the variable length array for those template recall(s) that have a net identifier that matches the particular network. After performing this action on all of the template recall 94 instances in DIF 26, the variable length array for the particular network contains the ordinates of template recalls 94 for each of the features within that network. An action such as calculating the capacitance of the particular network could then sequentially evaluate each template identifier 100 for each template recall 94 referenced in the variable length array for that network.

Less frequently used among the per-layer look-up-lists may be lists that are enumerations of material properties and layer dependent geometries. Among these lists are the thickness of the layer, lists for layer dependent geometry such as sidewall etch angle, layer thickness, dielectric constants and loss factors for the insulators comprising the each of the different layers, conductivities for the conductive material on each layer.

V. Operation Methodology

Figure 8:
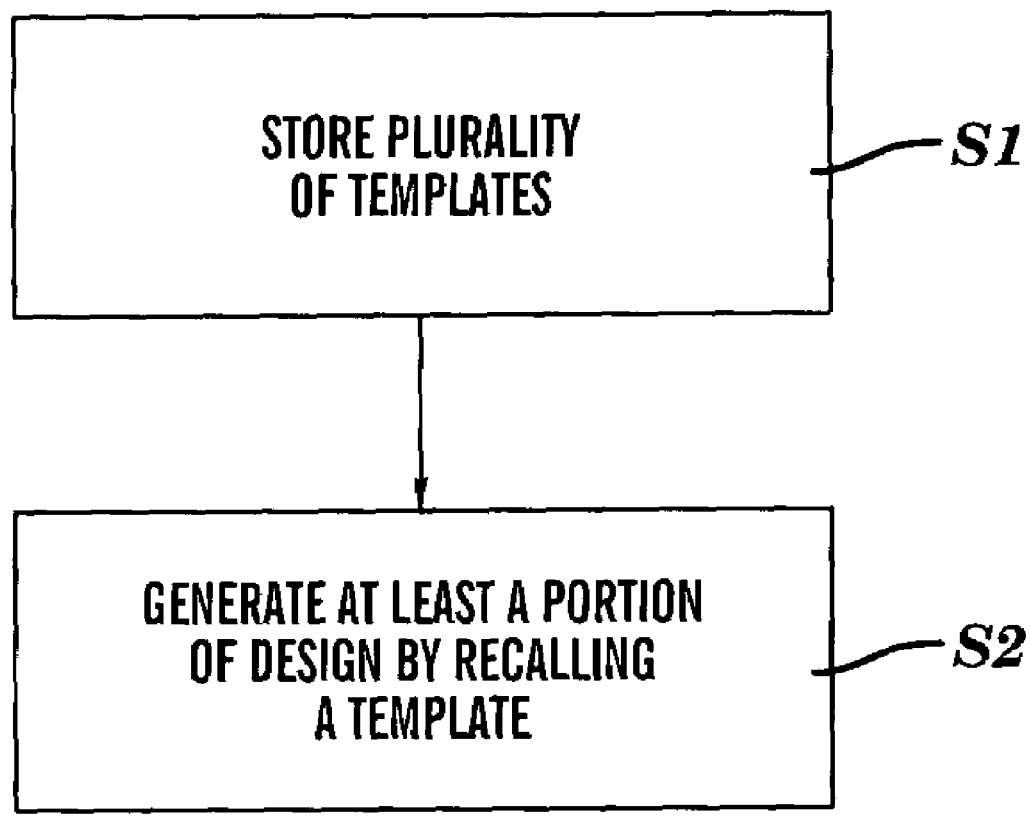
FIG. 8 shows an operational method of the system of FIG. 1.

Turning to FIG. 8, operation of system 10 according to the invention will now be described. It should be recognized that a variety of operational steps of system 10 may not be described for brevity.

A first step S1 for generating a design of an electronic circuit includes storing a plurality of templates 66 (FIG. 3), each template 66 including offset instruction 72 (FIG. 4) for generating unique design feature 60 (FIGS. 2A–B) relative to control point CP, as described above. In one embodiment, storing of templates 66 may be incorporated as part of the creation of features by a designer using EC designer 24. That is, creating DIF 16 such that DIF 16 includes a plurality of template recalls 94 (FIG. 6), each template recall 94 having a fixed width format. EC designer 24 may include any now known or later developed interfaces for use by a designer to create a design. For example, EC designer 24 may provide menus to select: circles, arcs, polygons, alphanumeric characters, rectangles, lines, squares, groupings of previously defined template selections. In another example, EC designer 24 may provide menus to specify: the geometric particulars of a template (e.g., the placement of the feature corners relative to the control point CP), and/or characteristics of the template, such as it's being an inside or an outside shape. In accordance with the invention and as shown in FIG. 1, however, EC designer 24 includes a template generator 30 that functions to generate a template 66 in one of two ways: selectively or through design evaluation.

In one embodiment, template generator 30 may include an interface (not shown) that allows a designer 2 to selectively create a template for a feature of the design that the designer knows is used repetitively. An interface for creating a template would be substantially equivalent to any now known interfaces for creating a design feature, except that a selection would be provided for designating a feature as a template 66. In this case, a designer 2 may selectively place a selection polygon (similar to bounding orthogonal polygonal border 74 in FIGS. 2A–2B) about a unique design feature to allow capture of practically any unique design feature, or set of features, as a template. The selection polygon also allows positioning of the unique design feature appropriately in conjunction with a control point CP. A query window substantially similar to common query windows used in PC operating systems may present queries to gather any information about the created template mentioned above, e.g., shape description, particular feature attributes, etc. Each template 66 (FIG. 1) is then stored in template database 20, and a DIF converter 34 of EC designer 24 correspondingly adjusts DIF 26 to include a required template recall 94 (FIG. 6) for the template. That is, where an instruction set for the previously created template exists, DIF converter 34 replaces the instruction set with a template recall 94 (FIG. 6). As designer 2 continues designing the electronic circuit, a template selector may be presented as part of the design interface for selection from a menu of saved templates. Alternatively, template generator 28 may include a design instruction file (DIF) evaluator 32 that evaluates a DIF 26 for an at least partially completed design for repetitive and unique design features, i.e., repetitive instruction sets. Each unique design feature is then stored as a template 66 (FIG. 1) in template database 20 by DIF evaluator 32, and DIF converter 34 converts instruction sets for features that can be implemented as a saved template as a template recall 94 in DIF 26.

As noted above, the storing step may also include organizing the plurality of templates according to at least one class 76 (FIG. 3) such as: circles, arcs, polygons, alphanumeric characters, rectangles, lines, squares, etc. In addition, the storing step may include storing a nested feature template 78 (FIG. 5) including an offset instruction 72 (FIG. 4) for generating a plurality of unique design features used in a design.

In a second step of operation, step S2, at least a portion of a design is generated, i.e., rendered, by recalling at least one template according to DIF 26. In this case, a template recaller 36 of EC generator 28 recalls a template 66 from template database 20 according to at least one template recall 94 in instruction list 90 of DIF 26. Design render unit 38 then generates or renders at least a portion of the design including the unique design feature of the recalled template. As discussed above, each template recall 94 includes control point positioning data 102 (FIG. 7) for positioning the control point CP for a respective template 66 relative to a design grid such that a respective unique design feature is generated relative to the control point.

In the previous discussion, it will be understood that the method steps discussed are performed by a processor, such as CPU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for generating a design of an electronic circuit having a plurality of design features, the method comprising steps of:
   storing a plurality of templates, each template including an offset instruction for generating a unique design feature relative to a control point; and
   generating at least a portion of the design according to a design instruction file that includes at least one template recall for recalling at least one template, each template recall having control point positioning data for positioning the control point for a respective template relative to a design grid such that a respective unique design feature is generated relative to the control point.

2. The method of claim 1, wherein the plurality of templates includes a template for each of a substantial portion of the unique design feature used in the design.

3. The method of claim 1, further comprising a step of creating the design instruction file such that the design instruction file includes a plurality of template recalls, each template recall having a fixed width format.

4. The method of claim 3, wherein each template recall further includes: a template identifier and a net identifier.

5. The method of claim 4, wherein the fixed width format includes 8 bytes for the control point positioning data, and one of 2 and 4 bytes for the template identifier and the same number of bytes for the net identifier as for the template identifier.

6. The method of claim 1, wherein each template includes a polygonal border with a respective control point located at a corner of the polygonal border, and wherein the offset instruction includes data for generating a respective feature relative to the control point.

7. The method of claim 1, wherein the storing step further includes organizing the plurality of templates according to at least one class of feature selected from a group consisting of: circles, arcs, polygons, alphanumeric characters, rectangles, lines and squares.

8. The method of claim 1, further comprising a step of storing a nested feature template including an offset instruction for generating a plurality of unique design features used in a design.

9. A computer-readable medium for storing data for access by an electronic circuit design system executing on a data processing system, the computer-readable medium including a data structure including:
   a plurality of data objects, each data object comprising:
   a template including an offset instruction for generating a respective design feature relative to a control point.

10. The computer-readable medium of claim 9, wherein the plurality of data objects include a template for each of a substantial portion of the unique design features used in the electronic circuit design.

11. The computer-readable medium of claim 9, wherein each template is recallable by a design instruction file executing on the electronic circuit design system, wherein the design instruction file includes a plurality of template recalls, each template recall having a fixed width format.

12. The computer-readable medium of claim 11, wherein each template recall includes a template identifier, control point positioning data for positioning the control point for a respective template relative to a design grid, and a net identifier.

13. The computer-readable medium of claim 9, wherein each template includes a polygonal border with a respective control point located at a corner of the polygonal border, and wherein the offset instruction includes data for generating a respective feature relative to the control point.

14. The computer-readable medium of claim 9, wherein the plurality of data objects are organized according to at least one class of feature selected from a group consisting of: circles, arcs, polygons, alphanumeric characters, rectangles, lines and squares.

15. The computer-readable medium of claim 9, wherein the plurality of data objects further include at least one nested template including an offset instruction for generating a plurality of unique design features used in a design.

16. A computer program product comprising a computer useable medium having computer readable program code embodied therein for generating an electronic circuit design, the program product comprising:
   program code configured to recall a template for a design feature based on a fixed width format template recall in a design instruction file; and
   program code configured to generate the design feature based on the template, wherein the template includes an offset instruction for generating the design feature relative to a control point.

17. The program product of claim 16, wherein the template is stored in a database including a plurality of templates, one template for each unique feature used in the electronic circuit design.

18. The program product of claim 16, wherein the design instruction file includes a plurality of template recalls, each template recall having a fixed width format.

19. The program product of claim 18, wherein said each template recall includes a template identifier and control point positioning data for positioning the control point for a respective template relative to a design grid.

20. A data processing system executing an application program and containing a database used by the application program, the data processing system comprising:
   a processor for executing the application program; and
   a memory including a data structure accessible by the application program, the data structure comprising:
   means for recalling a template for a design feature based on a fixed width format template recall in a design instruction file; and
   means for generating the design feature based on the template, wherein the template includes an offset instruction for generating the design feature relative to a control point.

* * * * *